United States Patent [19]

Havens et al.

[11] Patent Number: 5,438,301

[45] Date of Patent: Aug. 1, 1995

[54] MODEM HAVING A PHASE CORRECTOR AND A VOLTAGE CONTROLLED OSCILLATOR IMPLEMENTED USING A MULTI-STAGE RING OSCILLATOR

[75] Inventors: Joseph H. Havens, Tokyo, Japan; Robert K. Montgomery, Neshanic Station, N.J.

[73] Assignee: AT&T Corp., Murray Hill, N.J.

[21] Appl. No.: 280,638

[22] Filed: Jul. 25, 1994

[51] Int. Cl.⁶ .................... H03B 5/24; H03B 27/00
[52] U.S. Cl. .......................... 331/45; 331/57; 327/254
[58] Field of Search ............ 331/45, 56, 57, 60, 331/174, 177; 332/103–105, 144–148, 151, 152; 327/105, 171, 238, 254, 255, 295, 298; 333/138; 329/325, 336, 346, 360

[56] References Cited

U.S. PATENT DOCUMENTS

| | | | |
|---|---|---|---|
| 3,976,958 | 8/1976 | Seidel | 333/6 |
| 4,015,222 | 3/1977 | Werner | 332/151 X |
| 4,782,531 | 11/1988 | Karr et al. | 332/119 X |
| 4,806,888 | 2/1989 | Salrage et al. | 333/138 |
| 5,157,344 | 10/1992 | Ichihara | 329/336 |
| 5,180,994 | 1/1993 | Martin et al. | 331/45 X |
| 5,298,870 | 3/1994 | Cytera et al. | 331/45 |

FOREIGN PATENT DOCUMENTS

5-110369  4/1993  Japan .

Primary Examiner—David Mis

[57] ABSTRACT

A carrier generator circuit for use in a modem employed in a wireless communication system is described. The carrier generator circuit includes a voltage controlled oscillator comprising an N-stage ring oscillator to generate N balanced vectors of equal magnitude and arbitrary phase difference. The carrier generator circuit also includes a phase corrector to add two of the balanced vectors to generate a sum vector and to subtract the two balanced vectors to generate a difference vector. The sum vector and difference vector have a phase difference of 90 degrees. The sum vector represents an I (in-phase) carrier signal component and the difference vector represents a Q (quadrature-phase) carrier signal component. These I and Q carrier signal components can be used to transmit and receive data signals.

20 Claims, 6 Drawing Sheets

MODEM HAVING A PHASE CORRECTOR AND A VOLTAGE CONTROLLED OSCILLATOR IMPLEMENTED USING A MULTI-STAGE RING OSCILLATOR

BACKGROUND OF THE INVENTION

1. Field of the Invention

The present invention relates generally to modems (modulators/demodulators), and more particularly to the generation of I (in-phase) and Q (quadrature-phase) carrier signal components in modems.

2. Related Art

There are certain fundamental, high frequency building blocks that are in most wireless communication systems, such as cellular telephone systems. For example, most wireless communication systems employ modems (modulators/demodulators) that require the generation of both I (in-phase) and Q (quadrature-phase) carrier signal components to both transmit and receive data. These modems include a carrier generation circuit to generate such I and Q carrier signal components. Typically, a carrier generation circuit is implemented using a voltage controlled oscillator (VCO) connected to a quadrature (90 degree) phase splitter.

Conventionally, a carrier generation circuit operates at a single frequency. Such single frequency operation is due to the conventional implementation of the VCO and the quadrature phase splitter contained within the carrier generation circuit. Specifically, in VCOs and quadrature phase splitters, critical circuit elements are typically implemented using passive components, such as resistors, capacitors, fixed length transmission lines, etc. As a result, the operational frequency range (i.e., the bandwidth) of such VCOs and quadrature phase splitters is limited to a single frequency. This frequency can only be changed by re-designing and re-implementing the VCOs and quadrature phase splitters.

Since conventional VCOs and quadrature phase splitters are limited to a single operational frequency, it is very difficult to design and implement modems having a wide frequency bandwidth. As a result, conventional modems operate to limit the functionality of the wireless communication systems in which they are used.

Thus, what is required is a carrier generation circuit having a wide frequency bandwidth.

SUMMARY OF THE INVENTION

Briefly stated, the present invention is directed to a carrier generator circuit for use in a modem employed in a wireless communication system. The present invention is also directed to a modulator and a demodulator in a modem which uses this carrier generator circuit. The present invention is further directed to the modem itself.

The carrier generator circuit includes a voltage controlled oscillator comprising an N-stage ring oscillator to generate N balanced vectors of equal magnitude and arbitrary phase difference. The carrier generator circuit also includes a phase corrector to add two of the balanced vectors to generate a sum vector and to subtract the two balanced vectors to generate a difference vector. The sum vector and difference vector have a phase difference of 90 degrees. The sum vector represents an I (in-phase) carrier signal component and the difference vector represents a Q (quadrature-phase) carrier signal component. These I and Q carrier signal components are modulated to transmit data signals and demodulated to receive data signals. Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE FIGURES

The present invention will be described with reference to the accompanying drawings, wherein.

DETAILED DESCRIPTION OF THE PREFERRED EMBODIMENTS

1. Overview of the Invention

Figure 1:
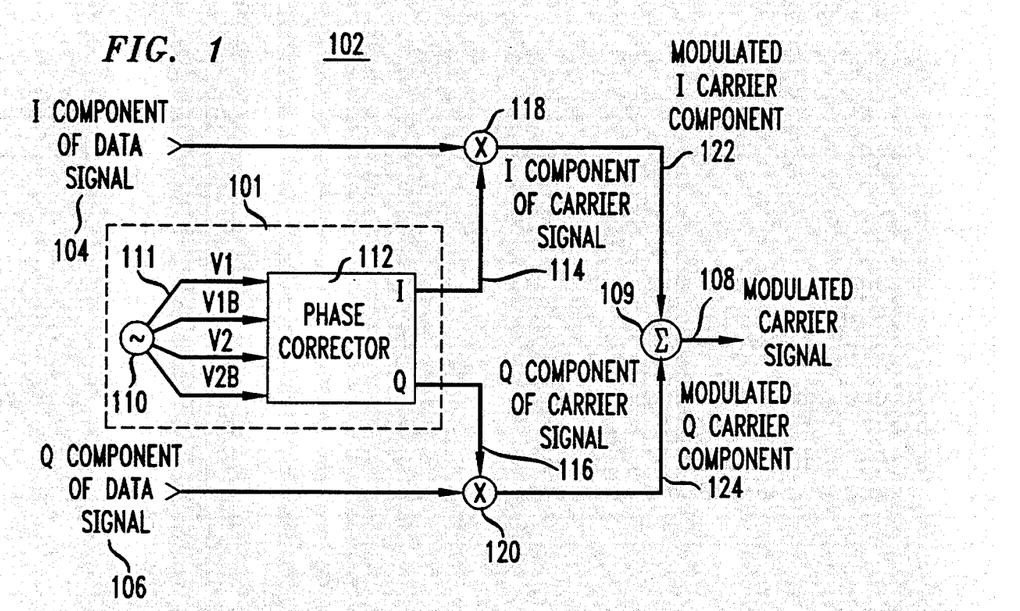
FIG. 1 is a block diagram of a modulator according to a preferred embodiment of the present invention.

FIG. 1 is a block diagram of a modulator 102 according to a preferred embodiment of the present invention. The modulator 102 includes a carrier generator circuit 101 that generates an I (in-phase) carrier signal component 114 and a Q (quadrature-phase) carrier signal component 116. The I carrier signal component 114 is 90 degrees out of phase with respect to the Q carrier signal component 116.

A multiplier 118 receives the I carrier signal component 114 and an I data signal component 104. The multiplier 118 operates in a well known manner to modulate the I carrier signal component 114 using the I data signal component 104 to produce a modulated I carrier signal component 122. Similarly, a multiplier 120 receives the Q carrier signal component 116 and a Q data signal component 106 (the I data signal component 104 and the Q data signal component 106 are generated from a data signal, not shown, in a well known manner). The multiplier 120 operates in a well known manner to modulate the Q carrier signal component 116 using the Q data signal component 106 to produce a modulated Q carrier signal component 124. The structure and operation of the multipliers 118, 120 will be apparent to persons skilled in the art.

A summation circuit 109 receives the modulated I carrier signal component 122 and the modulated Q carrier signal component 124. The summation circuit 109 operates in a well known manner to combine the modulated I carrier signal component 122 with the modulated Q carrier signal component 124 to thereby produce a modulated carrier signal 108. This modulated carrier signal 108 is further processed (as necessary) and transmitted in a well known manner by the modulator 102.

Figure 2:
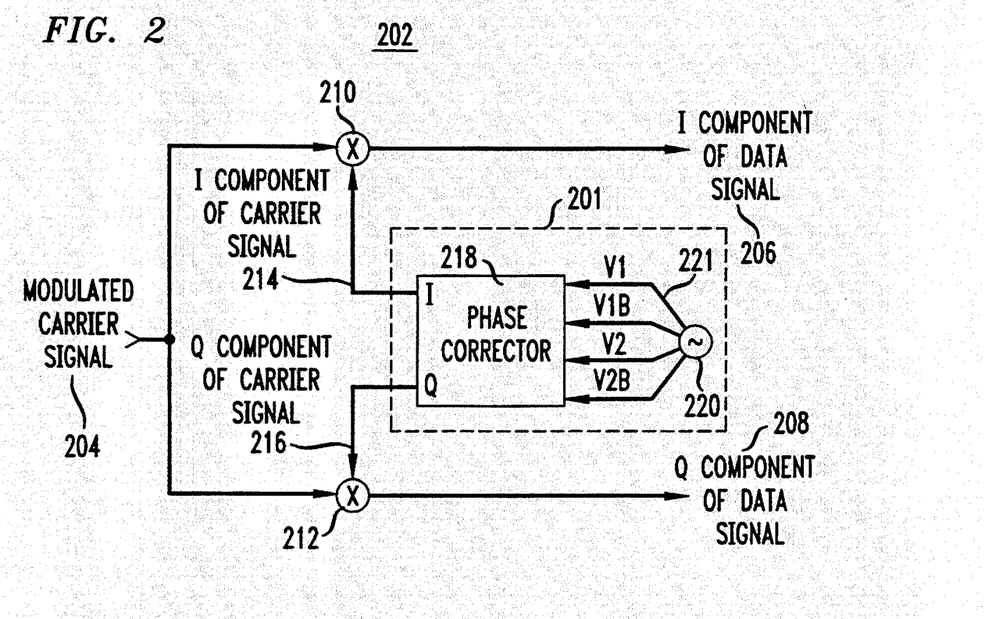
FIG. 2 is a block diagram of a demodulator according to a preferred embodiment of the present invention.

FIG. 2 is a block diagram of a demodulator 202 according to a preferred embodiment of the present invention. The structure and operation of the demodulator 202 are analogous to the structure and operation of the modulator 102. Specifically, the demodulator 202 includes a carrier generation circuit 201 having the same structure and operation of the carrier generation circuit 101 of the modulator 102. Also, the demodulator 202 includes multipliers 210, 212 which are similar in structure and operation to the multipliers 118, 120 of the modulator 102. The demodulator 202 differs from the modulator 102 in that the VCO 220 is phase locked to the received modulated carrier signal 204 by a carrier recovery means in a well known manner. Since the demodulator 202 operates analogous to the modulator 102 with the above exception, the following description of the invention shall focus on the modulator 102.

Referring again to FIG. 1, the carrier generator circuit 101 includes a voltage controlled oscillator (VCO) 110 and a phase corrector 112 (also called a phase correction circuit or a quadrature generator). According to the present invention, the VCO 110 generates two balanced signals which are generally indicated as 111. These two balanced signals 111 are provided to the phase corrector 112. Note that four signals are shown in FIG. 1 as being transmitted from the VCO 110 to the phase corrector 112. This is the case, since each balanced signal 111 comprises two signals (as is well known, a balanced signal comprises two identical signals, where one is the inverse of the other).

As will be appreciated by persons skilled in the art, a signal may be represented using a vector. Accordingly, the signals making up the balanced signals 111 are represented herein using vectors. Thus, the balanced signals 111 (which could also be called "balanced vectors") provided from the VCO 110 to the phase corrector 112 are labeled in FIG. 1 using vector designations "V1", "V1B", "V2", and "V2B", where the "B" stands for "bar" (i.e., inverse). The first balanced signal includes vectors "V1" and "V1B", and the second balanced signal includes vectors "V2" and "V2B".

According to the present invention, the balanced signals 111 generated by the VCO 110 are of equal magnitude. Additionally, these balanced signals 111 differ in phase by an arbitrary amount. The precise phase difference is not important. What is important is that they differ in phase by some amount.

According to well known vector algebra, when two vectors of equal magnitude and arbitrary phase difference are combined to form a sum vector and a difference vector, the sum vector and the difference vector are guaranteed to differ in phase by 90 degrees. In other words, the sum vector and the difference vector are guaranteed to be in quadrature.

The phase corrector 112 takes advantage of this well known vector algebraic principle to produce the I carrier signal component 114 and the Q carrier signal component 116. In particular, according to the present invention, the phase corrector 112 includes circuitry for producing the sum and difference of the balanced signals 111 provided to it from the VCO 110. As discussed above, these balanced signals 111 are of equal magnitude and arbitrary phase difference. Thus, the sum and difference vectors produced by appropriately combining the balanced vectors are guaranteed to be in quadrature. In the present invention, the sum and difference vectors represent the I carrier signal component 114 and the Q carrier signal component 116, respectively.

According to the present invention, the carrier generation circuit 101 has a wide frequency bandwidth. Accordingly, the modulator 102 has a wide frequency bandwidth (this is also true of the demodulator 202). This wide frequency bandwidth is achieved by using active components (such as transistors) to implement critical elements in the VCO 110 and the phase corrector 112. The tuned frequency bandwidth of the VCO 110 is approximately 30 to 60% of the center frequency with the phase corrector 112 bandwidth limited only by the upper operating frequency of the transistors used. The center frequency of oscillation can be established for many frequency bands on a single integrated circuit by actively selecting different N-stage VCOs of varying center frequency thereby achieving a modulator of bandwidth limited again only by the maximum transistor operating frequency.

The VCO 110 and the phase corrector 112 are discussed in detail below.

2. Brief Discussion of Vector Algebra

As discussed above, there is a well known vector algebraic principle that states that, when two vectors of equal magnitude and arbitrary phase difference are combined to form a sum vector and a difference vector, the sum vector and the difference vector are guaranteed to differ in phase by 90 degrees (i.e., to be in quadrature). The phase corrector 112 takes advantage of this well known vector algebraic principle to produce the I carrier signal component 114 and the Q carrier signal component 116. This vector algebraic principle is discussed in this section.

Figure 3:
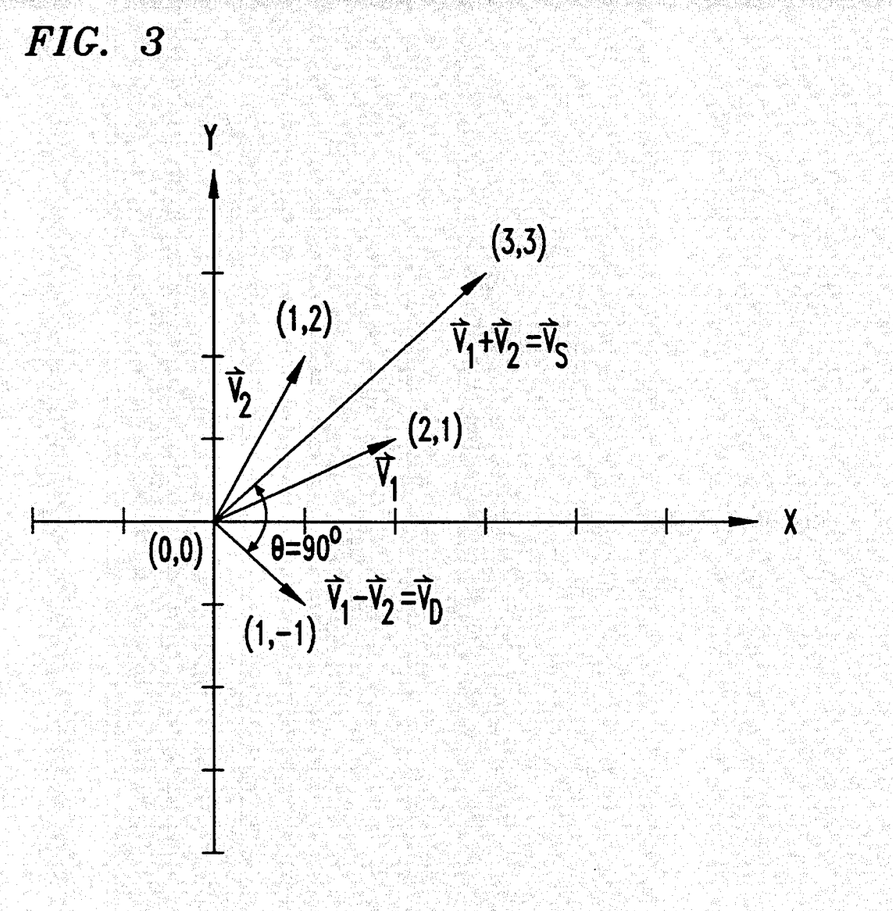
FIG. 3 is used to describe a well known vector algebraic principle.

This vector algebraic principle is depicted in FIG. 3, which illustrates two example vectors $\vec{V1}$ and $\vec{V2}$ which have equal magnitude ($\sqrt{5}$ units each) and which differ in phase by an arbitrary amount (36.87 degrees in this example). Vector $\vec{V1}$ extends from (x,y) coordinates (0,0) to (2,1). Vector $\vec{V2}$ extends from coordinates (0,0) to (1,2). A sum vector (called $\vec{VS}$ in FIG. 3), resulting from an element by element addition of vectors $\vec{V1}$ and $\vec{V2}$, is also shown in FIG. 3. Sum vector $\vec{VS}$ extends from (0,0) to (3,3). Similarly, a difference vector (called $\vec{VD}$ in FIG. 3), resulting from an element by element subtraction of vector $\vec{V2}$ from vector $\vec{V1}$, is shown in FIG. 3. Difference vector $\vec{VD}$ extends from (0,0) to (1,−1). It is clear from analysis of FIG. 3 that the sum vector $\vec{VS}$ differs in phase from the difference vector $\vec{VD}$ by 90 degrees. Thus, FIG. 3 confirms the correctness of the vector algebraic principle.

Confirmation of the vector algebraic principle is further established by the following analysis. For this analysis, recall the following trigonometric identities:

$$\sin^2 x + \cos^2 x = 1$$

$$\sin(A \pm B) = \sin A \cos B \pm \cos A \sin B$$

A vector dot product is defined as follows:

$$\vec{V}_1 \cdot \vec{V}_2 = |\vec{V}_1| |\vec{V}_2| \cos\phi,$$
where $\phi$ is the angle between $\vec{V}_1$ and $\vec{V}_2$.

Let
$\vec{V}_1 = V_{m1} \sin x$
$\vec{V}_2 = V_{m2} \sin(x + \phi)$ then $$\begin{aligned}\vec{V}_{sum} &= V_{m1}\sin x + V_{m2}\sin(x + \phi) = V_{m1} \sin x + \\ &\quad V_{m2} \sin x \cos\phi + V_{m2} \cos \\ &= (V_{m1} + V_{m2}\cos\phi) \sin x + (V_{m2}\sin\phi) \cos x\end{aligned}$$

-continued $$\overline{V}_{diff} = V_{m1}\sin x - V_{m2}\sin(x + \phi) = V_{m1} \sin x -$$
$$V_{m2} \sin x \cos\phi - V_{m2} \cos$$
$$= (V_{m1} - V_{m2}\cos\phi) \sin x + (-V_{m2}\sin\phi) \cos x$$

$$\overline{V}_{sum} \cdot \overline{V}_{diff} = \{V_{m1} + V_{m2} \cos\phi, V_{m2}\sin\phi\} \cdot$$
$$\{V_{m1} - V_{m2}\cos\phi, -V_{m2}\sin\phi\}$$
$$= V_{m1}^2 - V_{m2}^2\cos^2\phi - V_{m2}^2\sin^2\phi =$$
$$V_{m1}^2 - V_{m2}^2(\sin^2\phi + \cos^2\phi)$$
$$= V_{m1}^2 - V_{m2}^2$$

So $$\cos\phi = \frac{\overline{V}_{sum} \cdot \overline{V}_{diff}}{|\overline{V}_{sum}| \, |\overline{V}_{diff}|}$$

If $\overline{V}_{sum}$ and $\overline{V}_{diff}$ are non-zero,
then $|\overline{V}_{sum}| > 0$ and $|\overline{V}_{diff}| > 0$,
so for $\cos \phi$ to be zero, $\overline{V}_{sum} \cdot \overline{V}_{diff}$ must be zero.
And since $\overline{V}_{sum} \cdot \overline{V}_{diff} = V_{m1}^2 - V_{m2}^2$,
$\cos \phi = 0$ only when $V_{m1}^2 = V_{m2}^2$.

In other words, when $V_{m1}$ is equal to $V_{m2}$, o(which in this context is the angle between the sum and difference vectors) is 90 degrees such that the sum and difference vectors are in quadrature.

3. Voltage Controlled Oscillator

The VCO 110 in the modulator 102 shall now be generally described (this description also applies equally well to the VCO 220 in the demodulator 202).

According to the present invention, the VCO 110 is implemented as an N-stage ECL (emitter coupled logic) ring oscillator, where N is greater than or equal to two. The center oscillation frequency of the VCO 110 is established by the number of stages in the ring oscillator. At any particular time, the VCO 110 is tuned to a particular oscillation frequency, which is herein called the "tuned oscillation frequency" for reference purposes. As will be appreciated, the tuned oscillation frequency of the VCO 110 determines the frequency of the balanced signals 111 provided to the phase corrector 112.

According to the present invention, the tuned oscillation frequency may be adjusted about the center oscillation frequency by varying a control voltage that is applied to the VCO 110. Thus, it is not necessary to modify the circuit configuration of the VCO 110 in order to change the tuned oscillation frequency of the VCO 110. In the present invention, the frequency of the balanced signals 111 may be adjusted approximately 30 to 60% of the center oscillation frequency and the center oscillation frequency may be adjusted by actively changing the number of stages of the ring oscillator. This allows the VCO 110 frequency to be varied from near 0 Hz to the maximum transistor frequency.

According to the present invention, a balanced signal is generated by each stage of the ring oscillator that makes up the VCO 110. Preferably, all of these balanced signals are transmitted to the phase corrector 112. However, the phase corrector 112 preferably uses only two of these balanced signals to produce the I and Q carrier signal components 114, 116.

The balanced signals produced by the ring oscillator differ in phase from one another by some arbitrary amount. This phase difference is a function of the number of stages of the ring oscillator. Specifically, each stage of the ring oscillator introduces some delay into the propagation of signals through the VCO 110 such that the phase difference between balanced signals produced by a first stage and a second stage (wherein the second stage directly follows the first stage) is equal to the delay introduced by the first stage.

The delay introduced by each stage of the ring oscillator is the same. Consequently, the phase difference between consecutive stages is equal to the period of the balanced signals (as set by the tuned oscillation frequency) divided by the number of stages. Thus, if the tuned oscillation frequency is equal to 1 GHz, such that the period is equal to 1 nsec, the delay (or phase difference) introduced by each stage of a three stage ring oscillator is equal to ⅓ nanosecond.

According to the present invention, the balanced signals produced by the stages of the ring oscillator are equal in magnitude. This is achieved by using an identical circuit arrangement in each stage of the ring oscillator, where this circuit arrangement takes advantage of emitter coupled circuit technology. This is also achieved by implementing the phase corrector 112 such that the stages of the ring oscillator are identically loaded.

The VCO 110 in the modulator 102 shall now be described in greater detail with reference to FIGS. 4A and 4B, which collectively represent an example circuit diagram of the VCO 110. This circuit diagram represents a three-stage ECL ring oscillator, where stage 1 is denoted as 402, stage 2 is denoted as 404, and stage 3 is denoted as 406. It should be noted, however, that ring oscillators other than three stage ring oscillators may alternatively be used, as long as the number of stages is greater than or equal to two. The maximum center oscillation frequency of the three-stage ring oscillator shown in FIGS. 4A and 4B is approximately 5.1 GHz for silicon technology and 14.8 GHz for HBT (Heterojunction Biopolar Transistor) technology.

The VCO 110 includes a plurality of transistors and resistors. The transistors in FIGS. 4A and 4B are labeled using reference numbers having a "Q" prefix. The resistors in FIGS. 4A and 4B are labeled using reference numbers having a "R" prefix.

Figure 4A:
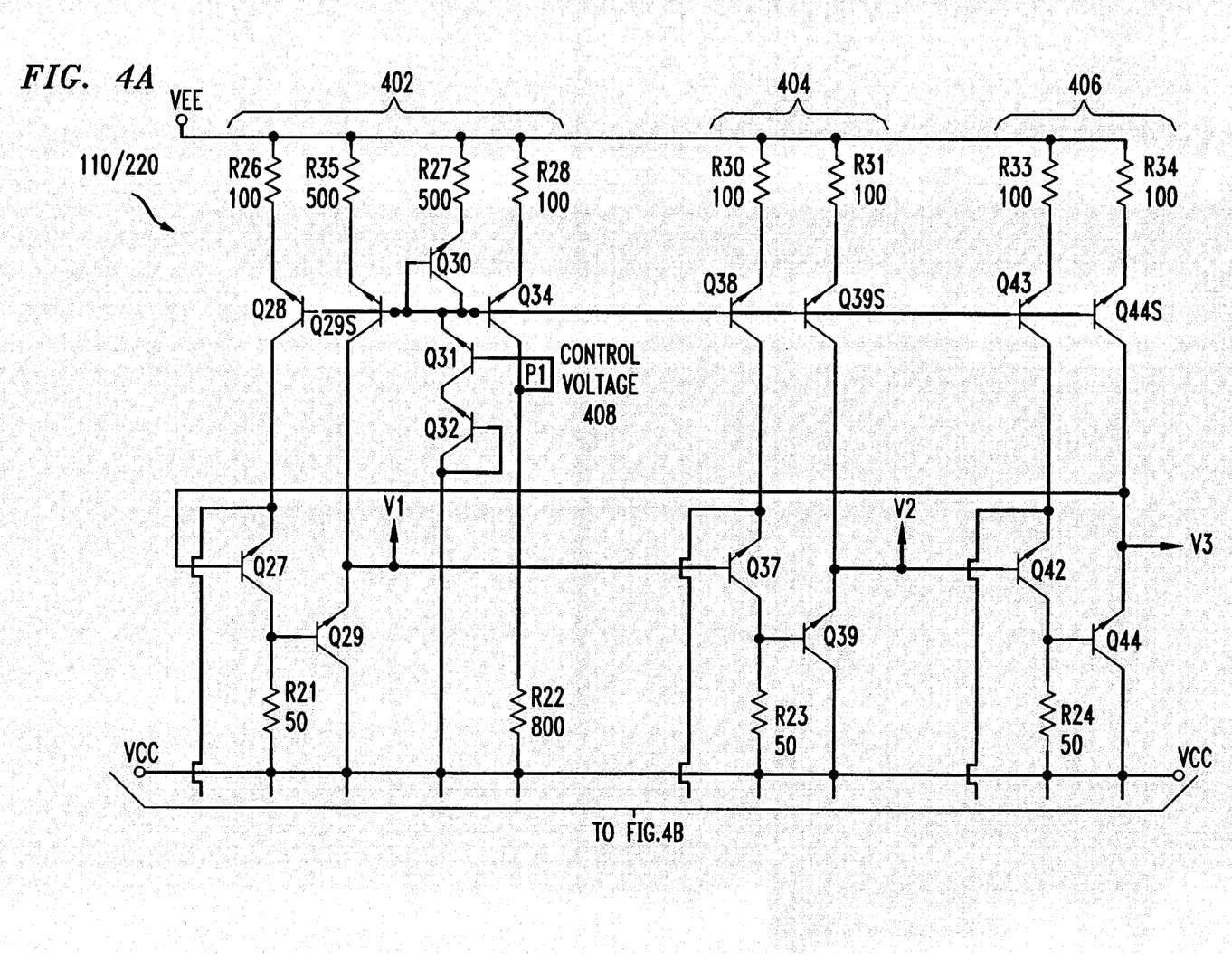
FIGS. 4A and 4B collectively represent a circuit diagram of a voltage controlled oscillator according to a preferred embodiment of the present invention.
Figure 4B:
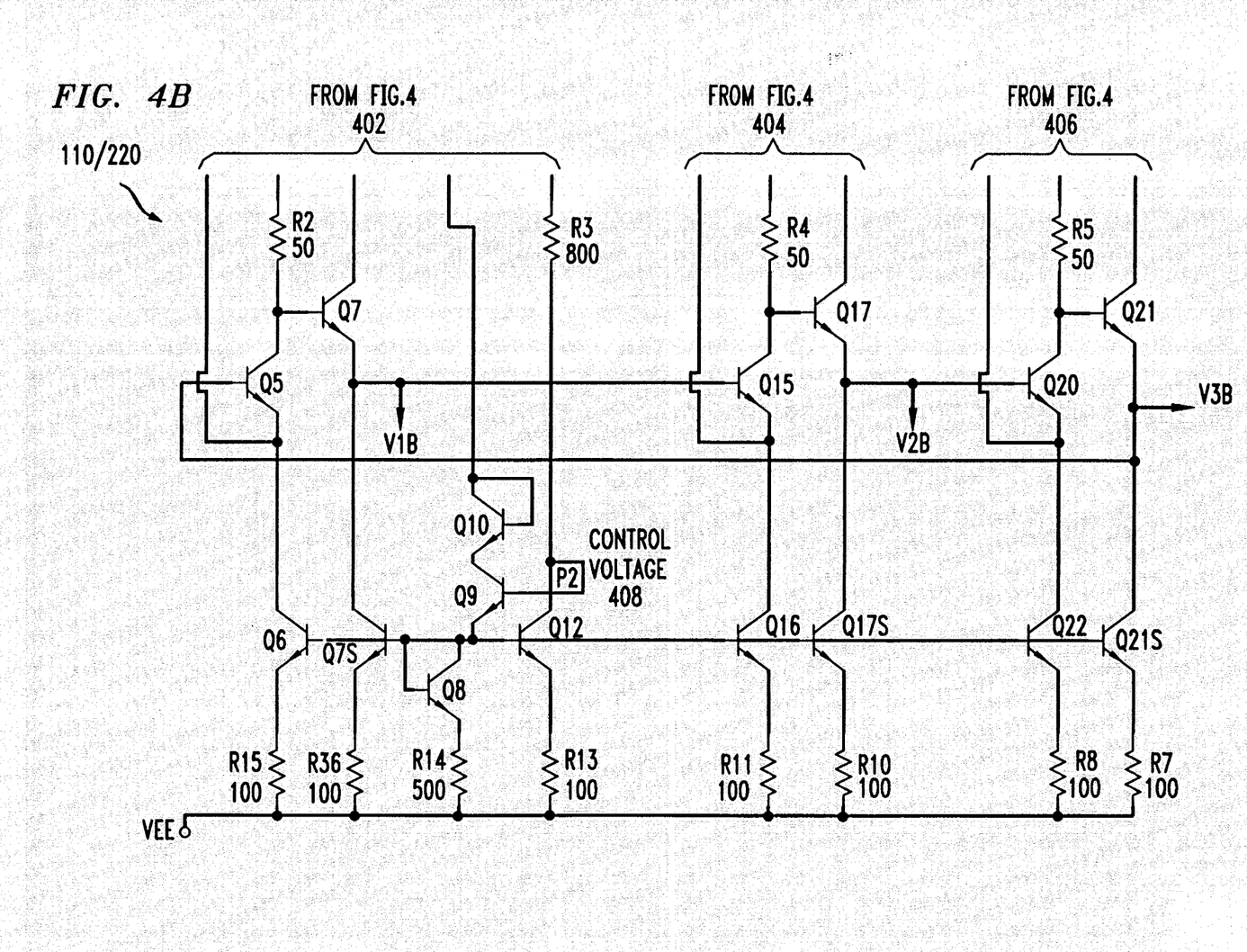

The transistors in the VCO 110 are preferably bipolar technology transistors, as denoted by the "BIPX" indicia shown in FIGS. 4A and 4B. The scale factor of these transistors is preferably 0.313. It should be understood, however, that transistors based on any other transistor technology may alternatively be used. Also, transistors having other scale factors may alternatively be used.

The preferred values of the resistors in the VCO 110 are shown in FIGS. 4A and 4B. These values are in "ohms". It should be understood, however, that other values of the resistors may alternatively be used. It should be further understood that resistors R2, R21, R4, R23, R5, and R24 may be replaced by other circuit elements such as diode connected transistors of arbitrary scale or a combination of RLCs and transistors. The above mentioned circuit elements (i.e., resistors, RLCs, diode connected transistors) are generally referred to herein as "gain setting loads".

Preferably, VCC is equal to 0 volts and VEE is equal to −3.6 volts.

Figure 5:
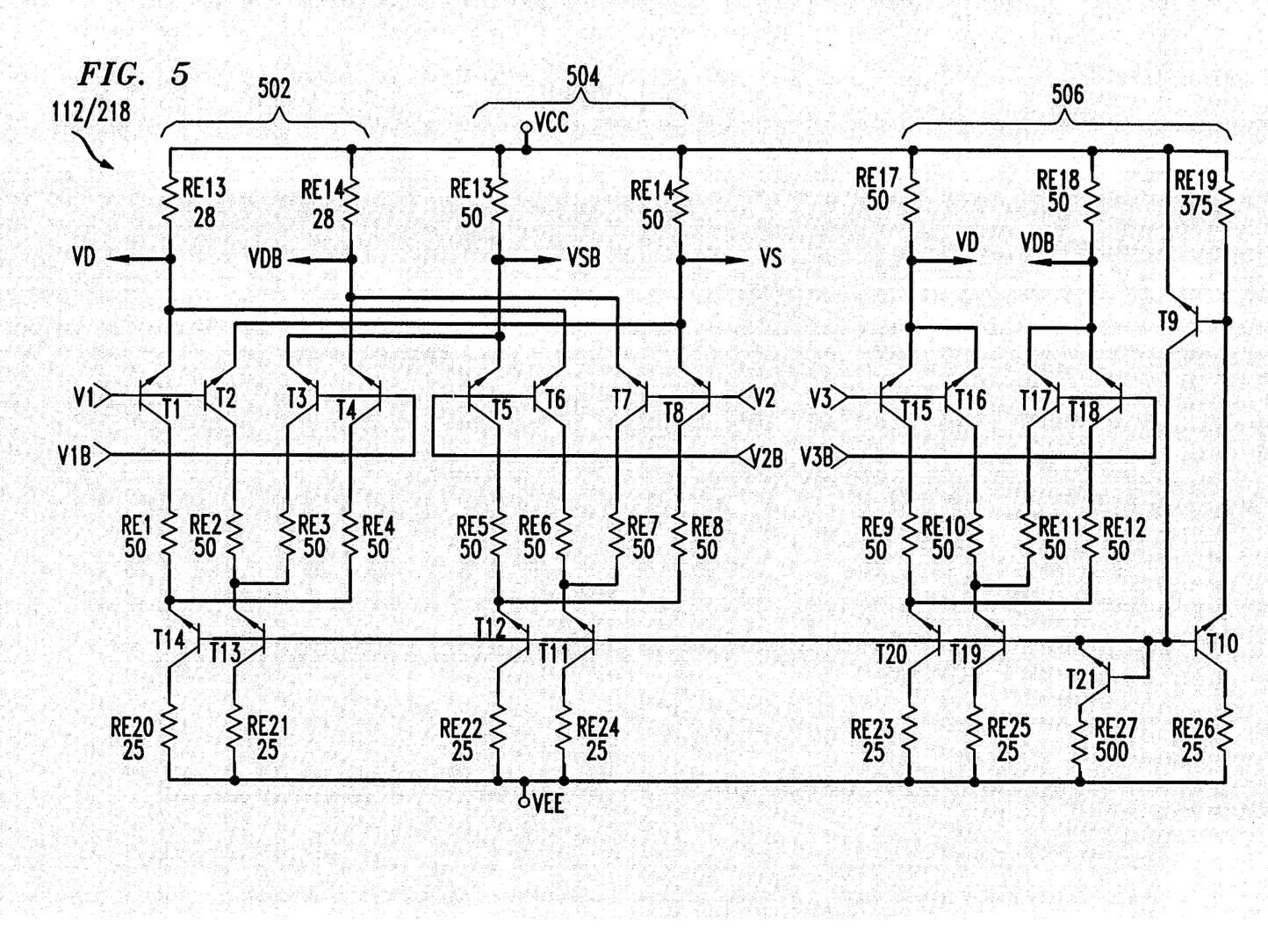
FIG. 5 is a circuit diagram of a phase corrector according to a preferred embodiment of the present invention.
Figure 6:
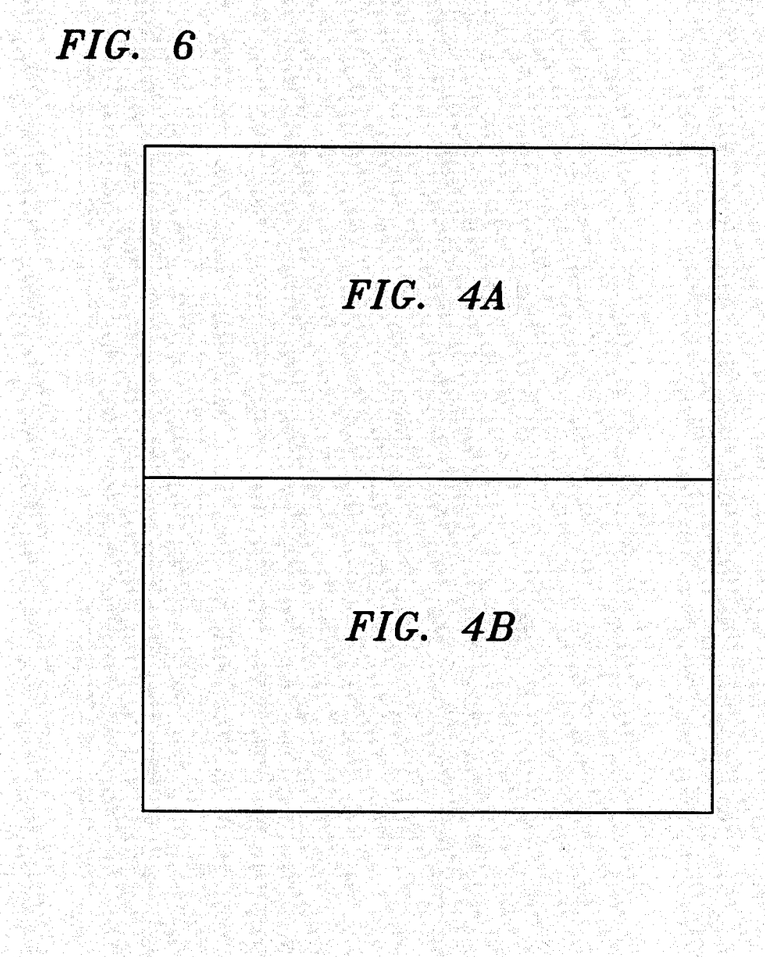
FIG. 6 indicates the orientation of FIG. 4A relative to FIG. 4B.

The signals at the emitters of transistors Q29, Q39, and Q44 are provided to the phase corrector 112. These signals each represent one half of a balanced signal. As will be appreciated by persons skilled in the art, a signal may be represented using a vector. Thus, these signals at the emitters of transistors Q29, Q39, and Q44 are treated herein as vectors, and are designated as vector V1, vector V2, and vector V3. Vectors V1 and V2 are shown in FIG. 1 as being provided to the phase corrector 112. Although not shown in FIG. 1, vector V3 is also preferably provided to the phase corrector 112 (this is shown in FIG. 5, described below).

As just noted, the VCO 110 generates vectors V1, V2, and V3, and these vectors each represent one half of a balanced signal. The other halves of these balanced signals are represented by vectors V1B, V2B, and V3B, respectively, which are also generated by the VCO 110. The manner in which the VCO 110 generates vectors V1B, V2B, and V3B is identical to the manner in which vectors V1, V2, and V3 are generated. Thus, the following discussion focuses on the generation of vectors V1, V2, and V3.

Transistors Q34, Q28, Q38, Q29S, Q39S, Q44S, and Q43 represent a well known current mirror. Thus, the current flowing through transistor Q34 (from emitter to collector) is mirrored through transistors Q28, Q29S, Q38, Q39S, Q44S, and Q43. In other words, the same current flows through transistors Q34, Q28, Q29S, Q38, Q39S, Q44S, and Q43. As a result, substantially the same current flows through resistors R21, R23, and R24, such that the voltage drop across these resistors R21, R23, and R24 is substantially the same (note that these resistors R21, R23, and R24 are all 50 ohms and in general are "gain setting loads" as described above).

Such current flowing through transistor Q34 (and mirrored through transistors Q28, Q29S, Q38, Q39S, Q44S, and Q43) is established and adjusted by application of a control voltage 408 to pads P1 and P2, which are respectively connected to the collectors of transistors Q34 and Q12, and to the bases of transistors Q31 and Q9. The voltage at the base of transistor Q34 is proportional to the control voltage 408 applied to pad P1. Accordingly, it is possible to vary the magnitude of the current flowing through transistor Q34 by varying the control voltage 408 applied to pad P1.

Similarly, the tuned oscillation frequency of the VCO 110 may be adjusted by adjusting the control voltage 408 applied to pad P1. Specifically, by changing the voltage 408 applied to pad P1, the collector current of Q34 is changed. This change in the collector current of Q34 is mirrored in the collectors of transistors Q28, Q29S, Q38, Q39S, Q44S, and Q43. This change in collector currents changes the emitter currents of transistors Q27, Q29, Q37, Q39, Q42, and Q44. As the emitter currents change, the voltage gain and phase of each ECL stage (3 in this example) 402, 404, and 406 shown in FIGS. 4A and 4B changes. A necessary condition for oscillation is that the net voltage gain of the ring oscillator be greater than 1 or equivalently 0 dB, and have a net phase change through the oscillator equal to 180 degrees. Thus, each stage for a 3 stage ring oscillator should contribute 60 degrees of phase shift. Actually, each stage of the ring oscillator is an inverter (i.e. 180° additional phase shift), so each stage contributes 180 degrees + 60 degrees = 240 degrees of phase shift. Hence the phase difference between vectors V1 and V2, V2 and V3, and V3 and V1, each equals 240 degrees for the N=3 ring oscillator. This further implies that the phase shift between vectors V1 and V2B, V2 and V3B, and V3 and V1B each equals 60 degrees. So for a given N stage ring oscillator, the angle between the vectors is fixed. This fact can be used to equalize the output amplitudes of the sum and difference vectors of the phase corrector 112. Also, for the N=2 ring oscillator case (not shown), the phase per stage will be 90 degrees and for this case the phase corrector 112 could be eliminated. As the emitter currents of transistors Q27, Q29, Q37, Q39, Q42, and Q44 get smaller, their emitter resistances get larger and this reduces the gain per stage of the ECL VCO 110. Also, the frequency at which the 180 degree condition achieved is lower. Thus, this combination of lower gain and lower 180 degree phase shift frequency causes the VCO 110 to oscillate at a lower frequency.

Thus, as is clear from the above description, the present invention enables the adjustment of the tuned oscillation frequency about a center oscillation frequency without re-design and/or re-implementation of the VCO 110. According to the present invention, the tuned oscillation frequency is adjusted by simply adjusting the control voltage 408 applied to the VCO 110.

Transistor Q31 is a "helper" transistor that reduces the sensitivity of the current mirror (i.e., transistor Q28, Q29S, Q34, Q38, Q39S, Q44S, and Q43) to any beta fluctuations of transistor Q28, Q29S, Q34, Q38, Q39S, Q44S, and Q43. Transistor Q30 establishes a small current (called a "trickle" current) to prevent transistor Q31 from turning off. Transistor Q32 represents a diode drop that reduces the voltage that appears across transistor Q31, to thereby prevent breakdown of transistor Q31.

Transistors Q29, Q39, and Q44 each represent a well known emitter follower. Thus, the respective voltages at the emitters of these transistors Q29, Q39, and Q44 follow the respective voltages at their bases.

Note that the voltage at the base of transistor Q29 is equal to VCC minus the voltage across transistor R21. Similarly, the voltage at the base of transistor Q39 is equal to VCC minus the voltage across transistor R23, and the voltage at the base of transistor Q44 is equal to VCC minus the voltage across transistor R24. As noted above, the voltage drop across resistors R21, R23, and R24 is substantially the same. Thus, the voltage at the respective bases of transistors Q29, Q39, and Q44 is substantially the same. Consequently, since these transistors Q29, Q39, and Q44 are emitter follows, the voltage at their respective emitters is essentially the same.

Since the voltages at the emitters of transistors Q29, Q39, and Q44 are equal in magnitude, the vectors V1, V2, and V3 are equal in magnitude. This is also true of vectors V1B, V2B, and V3B. Thus, based on the above description of the invention, it is clear that the VCO 110 produces balanced signals which are equal in magnitude.

According to the present invention, the phase corrector 112 is implemented such that the emitters of transistors Q29, Q39, Q44, Q7, Q17, and Q21 are equally loaded. As will be appreciated, this loading arrangement further ensures that the balanced signals will be equal in magnitude.

As discussed above, the balanced signals (V1/V1B, V2/V2B, V3/V3B) produced by the ring oscillator of the VCO 110 differ in phase from one another by 240 degrees as explained above. According to the present invention, each stage 402, 404, 406 of the ring oscillator introduces some delay into the propagation of signals through the VCO 110 such that the phase difference between the balanced signal V1/V1B and the balanced signal V2/V2B is equal to the delay introduced by the second stage 404. Similarly, the phase difference between the balanced signal V2/V2B and the balanced signal V3/V3B is equal to the delay introduced by the third stage 406. Also, the phase difference between the balanced signal V3/V3B and the balanced signal V1/V1B is equal to the delay introduced by the first stage 402. Note that the delay introduced by each stage 402, 404, 406 of the ring oscillator is the same.

The manner in which the stages 402, 404, 406 produce such delays shall now be described. Transistors Q27 and Q5 represent an emitter coupled pair. The collectors of these transistors Q27 and Q5 are connected to the bases of the emitter followers Q29 and Q7, respectively. The delay introduced by the first stage 402 is equal to the delay measured from the bases of the emitter coupled pair (transistors Q27 and Q5) to the emitters of the emitter followers Q29 and Q7.

Similarly, the delay introduced by the second stage 404 is equal to the delay measured from the bases of the emitter coupled pair (transistors Q37 and Q15) to the emitters of the emitter followers Q39 and Q17 in the second stage 404. The delay introduced by the third stage 406 is equal to the delay measured from the bases of the emitter coupled pair (transistors Q42 and Q20) to the emitters of the emitter followers Q44 and Q21 in the third stage 406.

Note that such delays generated by the stages 402, 404, 406 of the ring oscillator are non-zero. Thus, the balanced signals V1/V1B, V2/V2B, V3/V3B generated by the ring oscillator differ in phase by an arbitrary amount (in this case 240 degrees).

4. Phase Corrector

FIG. 5 is an example circuit diagram of the phase corrector 112 in the modulator 102 (this diagram also represents the phase corrector 218 in the demodulator 202). The phase corrector 112 includes a plurality of transistors and resistors. The transistors in FIG. 5 are labeled using reference numbers having a "T" prefix. The resistors in FIG. 5 are labeled using reference numbers having a "RE" prefix. These prefixes are used to distinguish them from prefixes used in FIGS. 4A and 4B.

As with the VCO 110, the transistors in the phase corrector 112 are preferably bipolar technology transistors, as denoted by the "BIPX" indicia shown in FIG. 5. The scale factor of these transistors is preferably 0.313. It should be understood, however, that transistors based on any other transistor technology may alternatively be used. Also, transistors having other scale factors may alternatively be used.

The preferred values of the resistors in the phase corrector 112 are shown in FIG. 5. These values are in "ohms". It should be understood, however, that other values of the resistors may alternatively be used.

As with the VCO 110, in FIG. 5 VCC is equal to 0 volts and VEE is equal to $-3.6$ volts.

The phase corrector 112 includes three stages, indicated as 502, 504, and 506. The first stage 502 of the phase corrector 112 is connected to the first stage 402 of the VCO 110. Similarly, the second stage 504 of the phase corrector 112 is connected to the second stage 404 of the VCO 110, and the third stage 506 of the phase corrector 112 is connected to the third stage 406 of the VCO 110. The first, second, and third stages 502, 504, 506 of the phase corrector 112 are substantially identical to one another. Thus, the first, second, and third stages 402, 404, 406 of the VCO 110 are identically loaded by the phase corrector 112. Such identical loading further ensures that the balanced signals V1/V1B, V2/V2B, and V3/V3B generated by the VCO 110 are equal in magnitude. Note that, generally, the number of stages of the phase corrector 112 is equal to the number of stages of the VCO 110. Also note that the third stage 506 is used solely for loading purposes in the modulator 102. For the demodulator 202, the third stage 506 provides an output frequency reference used to provide a means by which to phase lock VCO 220 to the modulated data signal 204 by a well known carrier recovery method.

The phase corrector 112 receives the balanced signals V1/V1B, V2/V2B, V3/V3B generated by the VCO 110. As discussed above, these balanced signals V1/V1B, V2/V2B, V3/V3B are of equal magnitude and 240 degree phase difference. Such attributes of the balanced signals V1/V1B, V2/V2B, V3/V3B are necessary for proper operation of the phase corrector 112. This is the case, since the phase corrector 112 takes advantage of the following vector algebraic principle to produce the I carrier signal component 114 and the Q carrier signal component 116: when two vectors of equal magnitude and arbitrary phase difference are combined to form a sum vector and a difference vector, the sum vector and the difference vector are guaranteed to differ in phase by 90 degrees. Specifically, the phase corrector 112 operates to combine the balanced signal V1/V1B with the balanced signal V2/V2B to thereby form a difference signal VD/VDB and a sum signal VS/VSB which are in quadrature. Such operation of the phase corrector 112 shall now be described in detail.

Transistors T1 and T4 represent a well known emitter coupled pair. Similarly, transistors T2 and T3, T5 and T8, T6 and T7, T15 and T18, and T16 and T17 represent well known emitter coupled pairs. Note that the collector of transistor T1 is connected to the collector of transistor T6. This connection of collectors operationally creates a well known summing device, such that the vector present at the common collector junction is equal to the negative sum of the vector at the base of transistor T1 and the vector at the base of transistor T6. The vector V1 is present at the base of transistor T1 and the vector V2B is present at the base of transistor T6. Thus, the vector present at the common collector junction is proportional to $-(V1+V2B)$. Recall that V2B is the inverse of V2 (they are 180 degrees out of phase). Consequently, the vector present at the common collector junction is proportional to $-(V1-V2)$. This vector is called the difference vector, or VD.

The collectors of transistors T4 and T7 are also connected together. For the reasons described above, the vector present at the common collector junction of transistors T4 and T7 is equal to the negative sum of the vector at the base of transistor T4 and the vector at the base of transistor T7. Vector V1B is present at the base of transistor T4 and vector V2 is present at the base of transistor T7. Thus, the vector present at the common collector junction of transistors T4 and T7 is proportional to $-(V1B+V2)$. Equivalently, the vector present at the common collector junction of transistors T4 and T7 is proportional to $-(V1B-V2B)$. This vector is called the inverse difference vector, or VDB. Vectors VD and VDB collectively represent a balanced difference vector.

The collectors of transistors T2 and T8 are connected together. Vector V1 is present at the base of transistor T2 and vector V2 is present at the base of transistor T8. Thus, the vector present at the common collector junction of transistors T2 and T8 is proportional to $-(V1+V2)$. This vector is called the sum vector, or VS.

The collectors of transistors T3 and T5 are connected together. Vector V1B is present at the base of transistor T3 and vector V2B is present at the base of transistor T5. Thus, the vector present at the common collector junction of transistors T3 and T5 is proportional to $-(V1B+V2B)$. This vector is called the inverse sum vector, or VSB. Vectors VS and VSB collectively represent a balanced sum vector.

Since balanced vectors V1/V1B and V2/V2B are of equal magnitude and 240 degree phase difference, their balanced sum vector VS/VSB and balanced difference vector VD/VDB are in quadrature. The balanced sum vector VS/VSB and balanced difference vector VD/VDB are provided to the multipliers 118, 120 as the I carrier signal component 114 and the Q carrier signal component 116, respectively.

Resistors RE13, RE14, RE15, and RE16 are used to ensure that the magnitudes of balanced vectors VD/VDB and VS/VSB are the same. More particularly, the values of resistors RE13, RE14, RE15, and RE16 are selected so that the magnitudes of balanced vectors VD/VDB and VS/VSB are the same over the operational bandwidth of the VCO 110. Accordingly, the values of resistors RE13, RE14, RE15, and RE16 only depend on the number of ECL stages used to set the center oscillation frequency of the VCO 110, since this sets the phase per stage to be (180 degrees)/N where N equals the number of ECL stages. Note that it is not necessary to re-design and/or re-implement the circuit diagram of the phase corrector 112 to adjust to changes in the tuned oscillation frequency, since the phase per stage is fixed independent of tuned frequency and only depends on the number of ECL stages.

Note that the collectors of transistors T15 and T16 are connected together, as are the collectors of transistors T17 and T18. Vector V3 is present at the bases of transistors T15 and T16, and vector V3B is present at the bases of transistors T17 and T18. Thus, the vector present at the common collector junction of transistors T15 and T16 is proportional to $-(V3+V3)$, or $-2*V3$. This vector is called VO. The vector present at the common collector junction of transistors T17 and T18 is proportional to $-(V3B+V3B)$, or $-2*V3B$. This vector is called VOB. In the present invention, vectors VO and VOB (which collectively represent a balanced vector) are not used in the modular to 102 but provide an output reference signal for phase locking of the VCO 220 in the demodulator 202. Transistors T15, T16, T17, and T18 are used solely for loading purposes in the modulator, as described below.

Resistors RE1, RE2, RE3, RE4, RE5, RE6, RE7, RE8, RE9, RE10, RE11, and RE12 ensure that emitter coupled pairs T1/T4, T2/T3, T5/T8, T6/T7, T15/T18, and T16/T17 operate in their linear ranges.

Transistors T14, T13, T12, T11, T20, T19, and T10 represent a well known current mirror. The current that flows through transistor T10 (from collector to emitter) is mirrored in transistors T14, T13, T12, T11, T20, T19 (from collector to emitter). This current mirror effectively sets the current flowing through transistors T1, T2, T3, T4, T5, T6, T7, T8, T15, T16, T17, and T18. The current flowing through transistor T10 is established in a well known manner by a combination of transistor T10 with transistor T9 and resister RE19. Transistor T21 establishes a trickle current to prevent transistor T9 from turning off.

The phase corrector 112 is also described in a Japanese patent application entitled "Phase Shifter", Japanese Serial No. 3-246563, filed Sep. 2, 1991, corresponding to Japanese laid-open patent application Kokai No. 5-110369, laid-open on Apr. 30, 1993, which is herein incorporated by reference in its entirety.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A carrier generator circuit for use in a modem employed in a wireless communication system, comprising:

a voltage controlled oscillator comprising an N-stage ring oscillator to generate N balanced vectors of equal magnitude and arbitrary phase difference; and a phase corrector to add two of said balanced vectors to generate a sum vector and to subtract said two of said balanced vectors to generate a difference vector, said sum vector and difference vector having a phase difference of 90 degrees, said sum vector representing an I (in-phase) carrier signal component and said difference vector representing a Q (quadrature-phase) carrier signal component.

2. The carrier generator circuit of claim 1, wherein N is equal to two.

3. The carrier generator circuit of claim 1, wherein N is equal to an integer value that is greater than two.

4. The carrier generator circuit of claim 1, wherein a first of said N stages of said ring oscillator comprises:

a first gain setting load having a first terminal and a second terminal, a VCC voltage being applied to said first terminal;

a first emitter follower having a base connected to said second terminal, said VCC voltage being applied to a collector of said first emitter follower, a first output vector representing part of one of said balanced vectors being available from an emitter of said first emitter follower; and a first portion of a current mirror connected to said second terminal to establish a first current flowing through said first gain setting load, said first current establishing a first voltage drop across said first gain setting load, said first output vector having a first magnitude equal to said VCC voltage minus said first voltage drop;

a second of said N stages comprising:

a second gain setting load having a first terminal and a second terminal, said VCC voltage being applied to said second gain setting load first terminal;

a second emitter follower having a base connected to said second gain setting load second terminal, said VCC voltage being applied to a collector of said second emitter follower, a second output vector representing part of another of said balanced vectors being available from an emitter of said second emitter follower; and a second portion of said current mirror connected to said second gain setting load second terminal to establish a second current substantially equal to said first current flowing through said second gain setting load, said second current establishing a second voltage drop across said second gain setting load, said second gain setting load having a gain setting load value substantially equal to that of said first gain setting load such that said second voltage drop is substantially equal to said first voltage drop, said second output vector having a second magnitude equal to said VCC voltage minus said second voltage drop, said second magnitude being substantially equal to said first magnitude.

5. The carrier generator circuit of claim 4, wherein each of said N stages of said ring oscillator introduces phase delay such that said balanced vectors generated by said ring oscillator are of arbitrary phase difference.

6. The carrier generator circuit of claim 5, wherein said first and second stages of said ring oscillator each comprises an emitter coupled pair, a base of said emitter coupled pair in said second stage connected to said emitter of said first emitter follower in said first stage, a collector of said emitter coupled pair in said second stage connected to said base of said emitter follower in said second stage, such that phase delay introduced by said second stage is equal to signal propagation delay from said base of said emitter coupled pair in said second stage to said emitter of said emitter follower in said second stage.

7. The carrier generator circuit of claim 1, wherein said phase corrector includes N identical stages, each stage of said phase corrector connected to a stage of said ring oscillator, such that said stages of said ring oscillator are identically loaded.

8. The carrier generator circuit of claim 7, wherein a first stage of said phase corrector comprises:
first and second emitter coupled pairs, said first and second emitter coupled pairs both receiving a first vector and an inverted first vector, said first vector and said inverted first vector representing one of said balanced vectors;
a second stage of said phase corrector comprising:
third and fourth emitter coupled pairs, said third and fourth emitter coupled pairs both receiving a second vector and an inverted second vector, said second vector and said inverted second vector representing another of said balanced vectors;
wherein a collector of a transistor forming part of said first emitter coupled pair, having a base connected to said first vector, being connected at a first common collector point to a collector of a transistor forming part of said fourth emitter coupled pair, having a base connected to said inverted second vector, a first output vector resulting from an addition of said inverted second vector and said first vector being available from said first common collector point, said first output vector representing a part of said difference vector; and
a collector of a transistor forming part of said second emitter coupled pair, having a base connected to said first vector, being connected at a second common collector point to a collector of a transistor forming part of said third emitter coupled pair, having a base connected to said second vector, a second output vector resulting from adding said first vector to said second vector being available from said second common collector point, said second output vector representing a part of said sum vector.

9. A modulator for use in a modem employed in a wireless communication system, comprising:

a voltage controlled oscillator comprising an N-stage ring oscillator to generate N balanced vectors of equal magnitude and arbitrary phase difference;
a phase corrector to add two of said balanced vectors to generate a sum vector and to subtract said two of said balanced vectors to generate a difference vector, said sum vector and difference vector having a phase difference of 90 degrees, said sum vector representing an I (in-phase) carrier signal component and said difference vector representing a Q (quadrature-phase) carrier signal component; and
means for modulating said I and Q carrier signal components using I and Q data signals, respectively.

10. The modulator of claim 9, wherein a first of said N stages of said ring oscillator comprises:
a first gain setting load having a first terminal and a second terminal, a VCC voltage being applied to said first terminal;
a first emitter follower having a base connected to said second terminal, said VCC voltage being applied to a collector of said first emitter follower, a first output vector representing part of one of said balanced vectors being available from an emitter of said first emitter follower; and
a first portion of a current mirror connected to said second terminal to establish a first current flowing through said first gain setting load, said first current establishing a first voltage drop across said first gain setting load, said first output vector having a first magnitude equal to said VCC voltage minus said first voltage drop;
a second of said N stages comprising:
a second gain setting load having a first terminal and a second terminal, said VCC voltage being applied to said second gain setting load first terminal;
a second emitter follower having a base connected to said second gain setting load second terminal, said VCC voltage being applied to a collector of said second emitter follower, a second output vector representing part of another of said balanced vectors being available from an emitter of said second emitter follower; and
a second portion of said current mirror connected to said second gain setting load second terminal to establish a second current substantially equal to said first current flowing through said second gain setting load, said second current establishing a second voltage drop across said second gain setting load, said second gain setting load having a gain setting load value substantially equal to that of said first gain setting load such that said second voltage drop is substantially equal to said first voltage drop, said second output vector having a second magnitude equal to said VCC voltage minus said second voltage drop, said second magnitude being substantially equal to said first magnitude.

11. The modulator of claim 10, wherein each of said N stages of said ring oscillator introduces phase delay such that said balanced vectors generated by said ring oscillator are of arbitrary phase difference.

12. The modulator of claim 11, wherein said first and second stages of said ring oscillator each comprises an emitter coupled pair, a base of said emitter coupled pair in said second stage connected to said emitter of said first emitter follower in said first stage, a collector of said emitter coupled pair in said second stage connected to said base of said emitter follower in said second stage, such that phase delay introduced by said second stage is equal to signal propagation delay from said base of said emitter coupled pair in said second stage to said emitter of said emitter follower in said second stage.

13. The modulator of claim 9, wherein said phase corrector includes N identical stages, each stage of said phase corrector connected to a stage of said ring oscillator, such that said stages of said ring oscillator are identically loaded.

14. The modulator of claim 13, wherein a first stage of said phase corrector comprises:
 first and second emitter coupled pairs, said first and second emitter coupled pairs both receiving a first vector and an inverted first vector, said first vector and said inverted first vector representing one of said balanced vectors;
 a second stage of said phase corrector comprising:
  third and fourth emitter coupled pairs, said third and fourth emitter coupled pairs both receiving a second vector and an inverted second vector, said second vector and said inverted second vector representing another of said balanced vectors;
 wherein a collector of a transistor forming part of said first emitter coupled pair, having a base connected to said first vector, being connected at a first common collector point to a collector of a transistor forming part of said fourth emitter coupled pair, having a base connected to said inverted second vector, a first output vector resulting from an addition of said inverted second vector and said first vector being available from said first common collector point, said first output vector representing a part of said difference vector; and
 a collector of a transistor forming part of said second emitter coupled pair, having a base connected to said first vector, being connected at a second common collector point to a collector of a transistor forming part of said third emitter coupled pair, having a base connected to said second vector, a second output vector resulting from adding said first vector to said second vector being available from said second common collector point, said second output vector representing a part of said sum vector.

15. A demodulator for use in a modem employed in a wireless communication system, comprising:
 a voltage controlled oscillator comprising an N-stage ring oscillator to generate N balanced vectors of equal magnitude and arbitrary phase difference;
 a phase corrector to add two of said balanced vectors to generate a sum vector and to subtract said two of said balanced vectors to generate a difference vector, said sum vector and difference vector having a phase difference of 90 degrees, said sum vector representing an I (in-phase) carrier signal component and said difference vector representing a Q (quadrature-phase) carrier signal component; and
 means for demodulating modulated I and Q carrier components using said I and Q carrier signal components.

16. The demodulator of claim 15, wherein a first of said N stages of said ring oscillator comprises:
 a first gain setting load having a first terminal and a second terminal, a VCC voltage being applied to said first terminal;
 a first emitter follower having a base connected to said second terminal, said VCC voltage being applied to a collector of said first emitter follower, a first output vector representing part of one of said balanced vectors being available from an emitter of said first emitter follower; and
 a first portion of a current mirror connected to said second terminal to establish a first current flowing through said first gain setting load, said first current establishing a first voltage drop across said first gain setting load, said first output vector having a first magnitude equal to said VCC voltage minus said first voltage drop;
 a second of said N stages comprising:
 a second gain setting load having a first terminal and a second terminal, said VCC voltage being applied to said second gain setting load first terminal;
 a second emitter follower having a base connected to said second gain setting load second terminal, said VCC voltage being applied to a collector of said second emitter follower, a second output vector representing part of another of said balanced vectors being available from an emitter of said second emitter follower; and
 a second portion of said current mirror connected to said second gain setting load second terminal to establish a second current substantially equal to said first current flowing through said second gain setting load, said second current establishing a second voltage drop across said second gain setting load, said second gain setting load having a gain setting load value substantially equal to that of said first gain setting load such that said second voltage drop is substantially equal to said first voltage drop, said second output vector having a second magnitude equal to said VCC voltage minus said second voltage drop, said second magnitude being substantially equal to said first magnitude.

17. The demodulator of claim 16, wherein each of said N stages of said ring oscillator introduces phase delay such that said balanced vectors generated by said ring oscillator are of arbitrary phase difference.

18. The demodulator of claim 17, wherein said first and second stages of said ring oscillator each comprises an emitter coupled pair, a base of said emitter coupled pair in said second stage connected to said emitter of said first emitter follower in said first stage, a collector of said emitter coupled pair in said second stage connected to said base of said emitter follower in said second stage, such that phase delay introduced by said second stage is equal to signal propagation delay from said base of said emitter coupled pair in said second stage to said emitter of said emitter follower in said second stage.

19. The demodulator of claim 15, wherein said phase corrector includes N identical stages, each stage of said phase corrector connected to a stage of said ring oscillator, such that said stages of said ring oscillator are identically loaded.

20. The demodulator of claim 19, wherein a first stage of said phase corrector comprises:
 first and second emitter coupled pairs, said first and second emitter coupled pairs both receiving a first vector and an inverted first vector, said first vector and said inverted first vector representing one of said balanced vectors;

a second stage of said phase corrector comprising:
third and fourth emitter coupled pairs, said third and fourth emitter coupled pairs both receiving a second vector and an inverted second vector, said second vector and said inverted second vector representing another of said balanced vectors;
wherein a collector of a transistor forming part of said first emitter coupled pair, having a base connected to said first vector, being connected at a first common collector point to a collector of a transistor forming part of said fourth emitter coupled pair, having a base connected to said inverted second vector, a first output vector resulting from an addition of said inverted second vector and said first vector being available from said first common collector point, said first output vector representing a part of said difference vector; and
a collector of a transistor forming part of said second emitter coupled pair, having a base connected to said first vector, being connected at a second common collector point to a collector of a transistor forming part of said third emitter coupled pair, having a base connected to said second vector, a second output vector resulting from adding said first vector to said second vector being available from said second common collector point, said second output vector representing a part of said sum vector.

* * * * *

UNITED STATES PATENT AND TRADEMARK OFFICE
CERTIFICATE OF CORRECTION

PATENT NO. : 5,438,301

DATED : August 1, 1995

INVENTOR(S) : Havens, et al

It is certified that error appears in the above-indentified patent and that said Letters Patent is hereby corrected as shown below:

In the Drawings:

Delete drawing sheet 5, and substitute therefor the drawing sheet, consisting of Figure 5, as shown on the attached page.

Signed and Sealed this

Twenty-third Day of April, 1996

Attest:

BRUCE LEHMAN

*Attesting Officer*  *Commissioner of Patents and Trademarks*

FIG. 5